United States Patent
Schubert et al.

(10) Patent No.: US 8,267,582 B2
(45) Date of Patent: Sep. 18, 2012

(54) TABLE GUIDED BY AEROSTATIC BEARING ELEMENTS FOR VACUUM APPLICATION

(75) Inventors: Gerhard Schubert, Jena (DE); Christian Jackel, Jena (DE); Ulf-Carsten Kirschstein, Jena (DE); Michael Boehm, Jena (DE); René Bauer, Jena (DE); Gerd Harnisch, Jena (DE); Thomas Peschel, Jena (DE); Stefan Risse, Jena (DE); Christoph Schenk, Jena (DE)

(73) Assignee: Vistec Electron Beam GmbH, Jena (DE)

( * ) Notice: Subject to any disclaimer, the term of this patent is extended or adjusted under 35 U.S.C. 154(b) by 558 days.

(21) Appl. No.: 12/421,798

(22) Filed: Apr. 10, 2009

(65) Prior Publication Data
US 2009/0255447 A1   Oct. 15, 2009

(30) Foreign Application Priority Data
Apr. 11, 2008   (DE) .......................... 10 2008 019 681

(51) Int. Cl.
*F16C 32/06*   (2006.01)
(52) U.S. Cl. ........................................ 384/12
(58) Field of Classification Search ................ 384/7, 9, 384/12; 74/490.08, 490.09; 138/114; 285/298, 285/302
See application file for complete search history.

(56) References Cited

U.S. PATENT DOCUMENTS

| | | | |
|---|---|---|---|
| 4,615,499 A * | 10/1986 | Knowler | 244/134 B |
| 4,657,182 A * | 4/1987 | Hoshi | 239/33 |
| 4,978,233 A * | 12/1990 | Stotzel et al. | 384/12 |
| 4,993,696 A | 2/1991 | Furukawa et al. | |
| 5,971,614 A * | 10/1999 | Kane et al. | 384/12 |
| 6,003,814 A * | 12/1999 | Pike et al. | 244/134 B |
| 6,315,449 B1 * | 11/2001 | Mueller | 384/12 |
| 6,499,880 B2 | 12/2002 | Tsuda et al. | |
| 6,603,130 B1 | 8/2003 | Bisschops et al. | |
| 6,735,867 B2 * | 5/2004 | Tsuda et al. | 29/898.02 |

FOREIGN PATENT DOCUMENTS

| | | |
|---|---|---|
| EP | 1211562 A1 | 6/2002 |
| EP | 1 235 115 A2 | 8/2002 |
| EP | 1780786 A1 | 5/2007 |

* cited by examiner

*Primary Examiner* — James Pilkington
(74) *Attorney, Agent, or Firm* — Patentbar International PC

(57) ABSTRACT

A table for vacuum application which is guided by aerostatic bearing elements, having a fixedly mounted supporting structure and a tabletop which is displaceable in x-direction and y-direction with respect to the fixedly mounted supporting structure by means of slides. The slides are provided with the aerostatic bearing elements for guiding, these aerostatic bearing elements being connected to feed lines for supplying the gas required for the operation of the gas bearings and suction lines for removing this gas. The suction lines comprise at least one variable-length line arrangement having a first pipe member and a second pipe member which penetrate one inside the other without contacting, at least one sealing gap being provided between the pipe members.

10 Claims, 6 Drawing Sheets

TABLE GUIDED BY AEROSTATIC BEARING ELEMENTS FOR VACUUM APPLICATION

RELATED APPLICATIONS

This application claims priority to German Patent Application No. DE 10 2008 019 681.9, filed Apr. 11, 2008, which is incorporated herein by reference in its entirety.

FIELD OF THE INVENTION

The invention is directed to a table which is precision-guided by gas bearing elements in accordance with the preamble of the main claim and which is suitable for vacuum application.

BACKGROUND OF THE INVENTION

Tables of this kind are known in general, for example, from EP 1235115 A2 and U.S. Pat. No. 6,499,880 B2. Gas-guided or air-guided tables of this kind which are suitable for use in a vacuum environment usually comprise two axes which are oriented, for example, in x-direction and y-direction and can move under high-vacuum conditions. Gas bearing elements or air bearing elements are used, for example, on a fixed base plate, for virtually frictionless motion. Usually, slides are movable on guide rails, e.g., in the form of bars, along one axis, e.g., the x-axis, and a connection rail, e.g., in the form of a crossbar, is arranged between these slides in direction of the other axis, e.g., the y-axis, along which another slide runs, this slide carrying a tabletop arrangement, for example.

Operation of the gas bearing elements or air bearing elements requires gas under pressure to be supplied to the aerostatic bearing elements or gas guides. For aerostatic bearing elements and guides used under vacuum, the gas which is needed for operation and which is supplied continuously must be discharged again virtually completely before it can enter the vacuum environment. Sealing structures formed from evacuable ducts and sealing gaps whose sealing surfaces can also coincide with the surfaces of the guide are used for this purpose. The combination of suction channel and sealing gap is called a suction stage. The flow of gas into the vacuum can be gradually reduced through a series of suction stages arranged one behind the other.

During a relative movement between the components of the gas guide, the lines for supplying and discharging the gas may not be allowed to transmit any constraining forces to the guide so as not to impair its guide characteristics. For this reason, in the prior art mentioned above, highly flexible lines are used, or the lines are integrated in the rails or bars for the movement of the slides or are integrated in the slides themselves. In order to transfer the gas between the components moving relative to one another when integrated lines are used, there is a bore hole in one component that runs through a channel located in the second component. This solution requires expanded sealing gaps which must extend along a length of the channels that is determined by the movement path. This calls for a larger installation space, and sealing problems can occur.

SUMMARY OF THE INVENTION

It is the object of the invention to provide a table suitable for use in a vacuum environment which is precision-guided by means of aerostatic bearing elements and in which no constraining forces which could impair the guide characteristics are transmitted during the relative movement between the components of the gas guides, and which ensures a satisfactory seal relative to the vacuum.

This object is met according to the invention by a table which is guided by gas bearing elements or aerostatic bearing elements and comprising a supporting structure for the table; slides coupled to the aerostatic bearing elements, the slides serving to guide the aerostatic bearing elements; feed lines for supplying a gas for operation of the aerostatic bearing elements; suction lines for removing the gas, the suction lines comprising at least one variable-length line arrangement comprising a first pipe member and a second pipe member moving one inside another without contacting one another; at least one sealing gap provided between the first pipe member and the second pipe member; and a tabletop displaceable by the slides in an x-direction and a y-direction with respect to the supporting structure.

Advantageous further developments and improvements are made possible by the steps indicated in the dependent claims.

Due to the fact that the suction lines comprise at least one variable-length line arrangement having a first pipe member and a second pipe member which penetrate one inside the other without contacting, at least one sealing gap being provided between the pipe members, the movements of the movable components of the table are not negatively influenced and no unwanted constraining forces are exerted on the aerostatic bearing elements or gas guides.

In an advantageous manner, at least one line arrangement whose length can be varied in the x-direction and at least one line arrangement whose length can be varied in the y-direction are used in the suction lines, and the penetration depth between the two pipe members changes depending on the movement in the x-direction or y-direction.

It is particularly advantageous that the number of variable-length line arrangements provided in the x-direction and y-direction is the same as the number of suction stages arranged one behind the other for gradually reducing the supplied gas flow into the surrounding vacuum, so that a line arrangement with a variable total length is made available for the suction lines of every suction stage of the aerostatic bearing elements.

A sealing action that is not dependent upon the movement range is achieved in that the sealing gaps of the variable-length line arrangements are arranged parallel to the movement direction according to the invention.

In a preferred embodiment example, the respective first pipe member of the line arrangements whose length can be varied in the x-direction is fixedly connected to the fixedly mounted supporting structure which can be constructed as a base plate, and the respective second pipe member, namely, the penetrating pipe, is arranged at a first slide so that the movements of the slide corresponding to the x-axis are not impeded by the penetration of the penetrating pipe(s) into the respective stationary pipe and so that the penetrating pipe is not impeded when moving out because the penetrating pipes also run in the stationary pipe members without contact. In a corresponding manner, the pipe members of the line arrangements whose length is variable in y-direction are arranged at the first slide or connection rail on one side and at the second slide on the other side so that the movement of the slide in y-direction is also not impeded by the noncontacting in-and-out movement of the pipe members.

The pipe cross section need not necessarily be circular, but can have any advantageous shape, e.g., can be rectangular.

The axes defined by the x-direction and y-direction are advantageously formed so as to be movable at an angle relative to one another, and the suction lines between the components which can change with respect to angle have flexible and/or elastic intermediate pieces so that the angular movements can be followed.

In an advantageous embodiment form, an aerostatic bearing element, e.g., an aerostatic bearing bushing, is arranged between the first pipe member and the second pipe member of the variable-length line arrangements for simultaneously guiding and sealing the pipe members. This arrangement is particularly advantageous when a plurality of variable-length line arrangements arranged adjacent to one another are provided for the individual suction stages, and the aerostatic bearing elements of the pipe members are combined to form an assembly. In this way, the gas exiting from these aerostatic bearing elements in direction of the vacuum system can be gradually reduced through single-stage or multi-stage sealing systems of the aerostatic bearing elements, the suction channels of the sealing stages being connected to the corresponding variable-length line arrangements.

In another advantageous embodiment form, a plurality of variable-length line arrangements of the various suction stages are nested one inside the other, a sealing gap being provided between the first pipe member and the second pipe member, and the gas exiting from the sealing gap of a line arrangement is received by the line arrangement with a lower pressure level. In this way, the gas exiting from the location where the pipes penetrate can be reduced through an individual circumferential sealing gap, and the gas flow exiting from the sealing gap of a first pipe system is received by a second pipe system, and gas exits into the vacuum system only from the sealing gap of the pipe system having the lowest pressure.

In another advantageous embodiment form, a plurality of variable-length line arrangements of different suction stages are arranged adjacent to one another, and at least one line arrangement has a sealing system between the first pipe member and the second pipe member, which sealing system comprises two sealing gaps and a suction channel located therebetween, and at least one line arrangement which is closer to the vacuum with respect to pressure has a sealing gap between the first pipe member and the second pipe member, the suction channel of the first line arrangement being connected to the second line arrangement which is closer to the vacuum. In this way, it is possible again to combine a plurality of line arrangements and pipe systems for conducting gaseous media at different pressure levels from atmospheric pressure to high vacuum so that the suction channels of the sealing systems of the aerostatic bearing elements are evacuated by means of pipelines of corresponding pressure levels.

The pipe members are made from a material of high specific rigidity, low coarseness and low adsorption capacity, for example, from high-density ceramics, so that low sealing gap heights can be set in a stable manner in view of the low deflection, the amount of exiting gas is therefore reduced and, when one pipe member moves out of the other. Only a small population of molecules occurs on the surface of the pipe member that is moving out.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
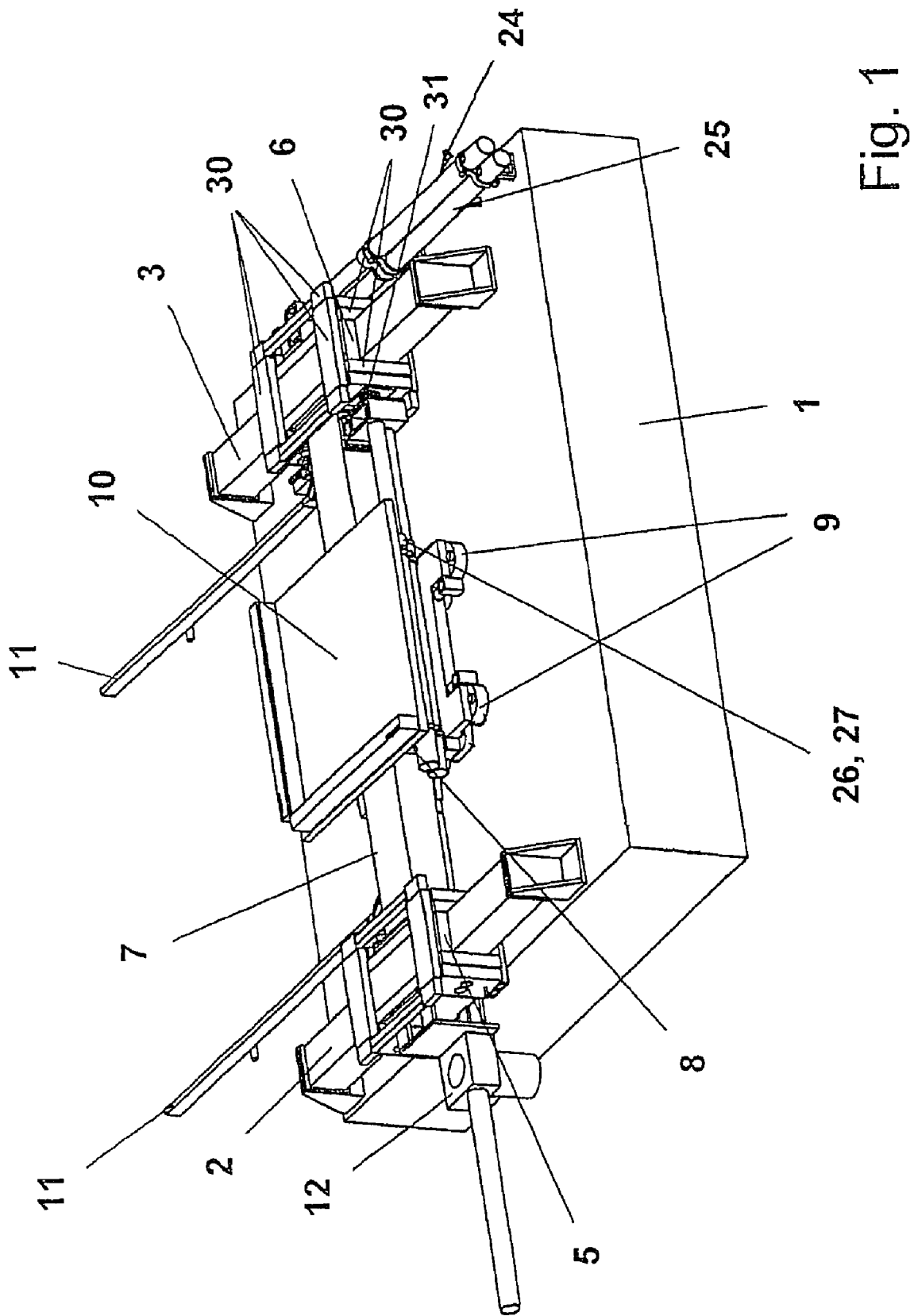
FIG. 1 shows a perspective view of the gas-guided table according to the invention.
Figure 2:
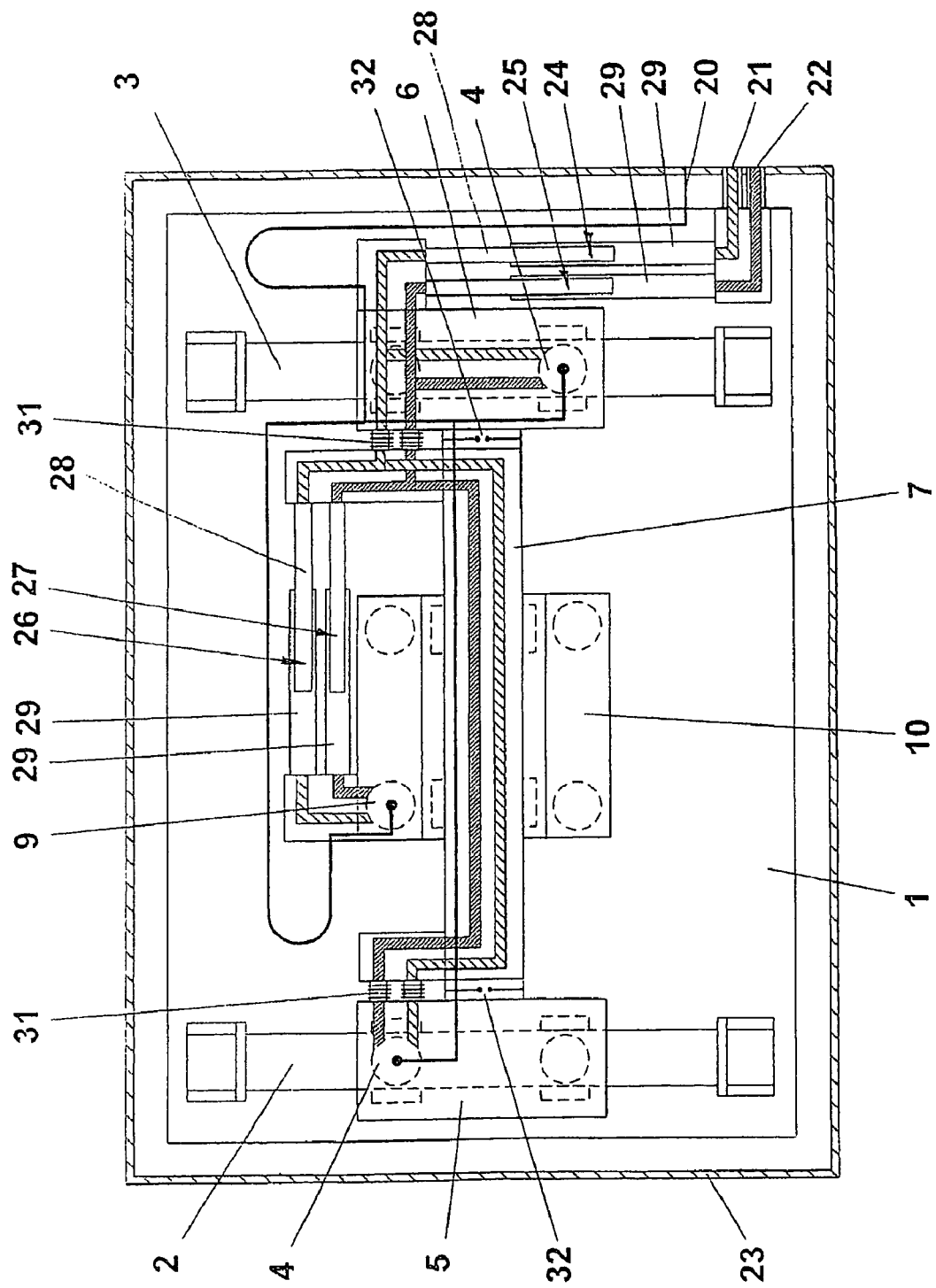
FIG. 2 shows a plan view of the table according to the invention, wherein the feed lines for supplying the gas to the aerostatic bearing elements and the suction lines for removing the gas from the aerostatic bearing elements are shown schematically.

The table shown in FIG. 1 and FIG. 2 which is precision-guided by aerostatic bearing elements has a fixedly mounted supporting structure which is constructed as a base plate 1. Two guide rails 2, 3 which extend corresponding to an x-axis or in the x-direction and which are constructed as longitudinal bars are fastened to the base plate 1. Movable slides 5, 6 (first slide) run on the guide rails 2, 3 by means of aerostatic bearing elements 4 (see FIG. 2). A connection rail 7 which is constructed as a crossbar is connected to the slides 5, 6 and is displaceable in x-direction together with the slides 5, 6. A slide 8 which is guided on the base plate 1 by aerostatic bearing elements 9 runs along the connection rail 7 forming the y-axis. The bearing elements 4 and 9 can also be constructed only for the base plate or only for the guide rails, respectively. The slide 8 carries a tabletop 10 on which components to be processed, e.g., wafers, are supported. X-drives 11 and a y-drive 12 are provided for the two axes in x-direction and in y-direction.

Figure 3:
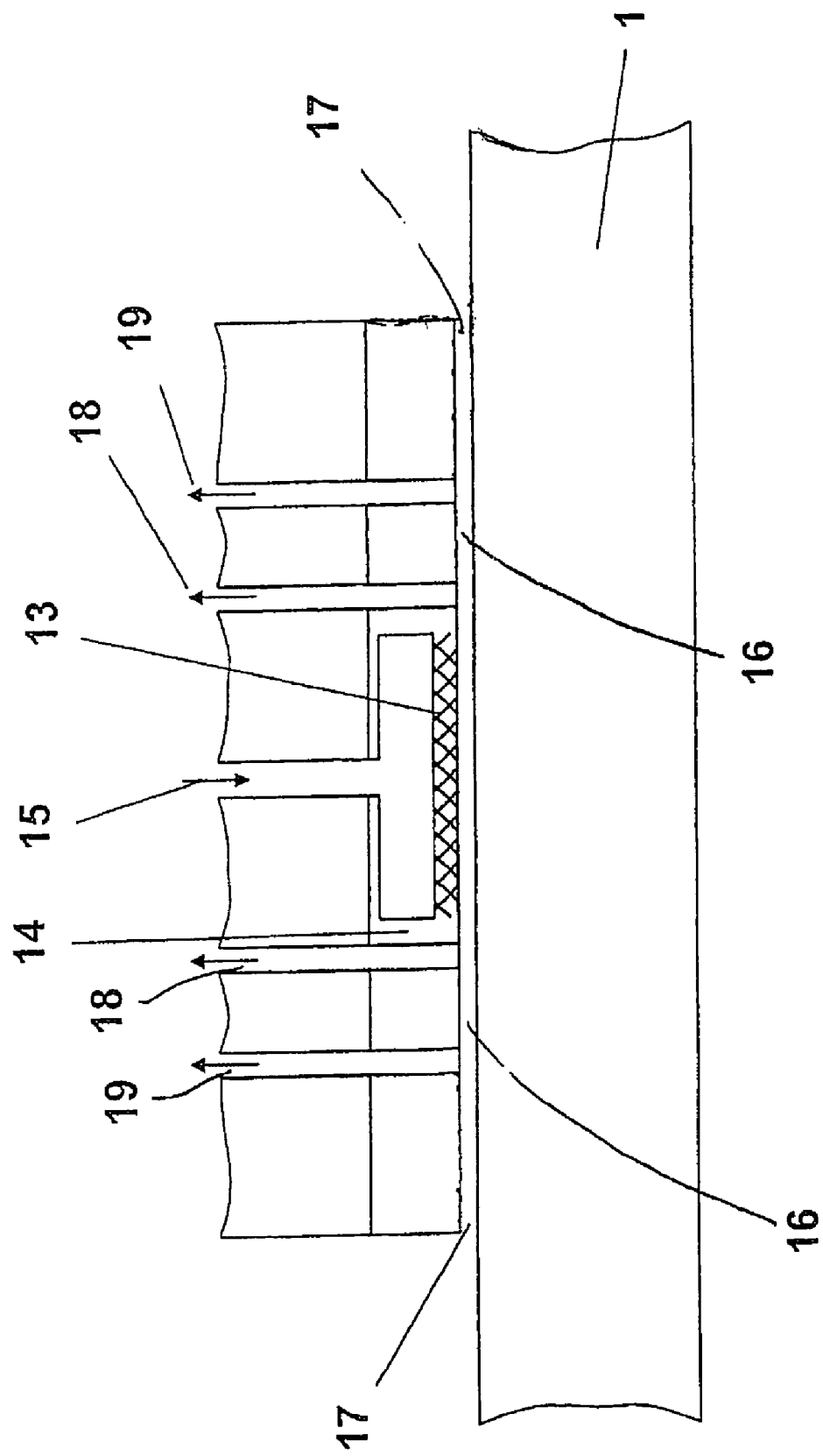
FIG. 3 shows a schematic layout of an aerostatic bearing element used in the gas-guided table according to the invention.

An aerostatic bearing element corresponding, for example, to aerostatic bearing element 9 is shown schematically in FIG. 3. The base plate is again designated by 1. The key part of the bearing element is the supporting region 13 in which the supporting air film or gas film is formed. The supporting region 13 is connected to a gas feed 15, gas which is under pressure being fed through the latter and throttled, e.g., by a porous material or individual nozzles, so as to be streamed into a gap 14. A first sealing gap 16 and a second sealing gap 17 are integrated in the aerostatic bearing element so as to surround the supporting region. A first suction channel 18 is arranged between the first sealing gap 16 and the supporting region 13, and a second suction channel 19 is arranged between the first sealing gap 16 and second sealing gap 17. The first sealing gap 16 and the suction channel 18 form a first suction stage for a first vacuum, which is formed in the pressure range between $10^3$ torr and $10^{-2}$ torr, and the second sealing gap 17 and second suction channel 19 form a second suction stage for a second vacuum formed in a pressure range between $10^{-1}$ torr and $10^{-6}$ torr.

The gas feed channel 15 is connected to feed lines 20 (see FIG. 2) for gas under pressure from a gas source, not shown, while the suction channel 18 of the first suction stage is connected to suction lines 21, shown by widely-spaced hatching in FIG. 2, and the suction channel 19 of the second suction stage is connected to the suction lines 22 indicated by closely-spaced hatching. The suction lines 21 and 22 are connected to vacuum pumps arranged outside the vacuum chamber 23.

FIG. 2 shows only a portion of the feed lines 20 guided to the aerostatic bearing elements 4, 9 and of the suction lines 21, 22 leading away from the aerostatic bearing elements 4, 9. Of course, they are also connected to the rest of the bearing elements.

As can be seen from FIG. 1 and FIG. 2, variable-length line arrangements 24, 25 for the x-direction and variable-length line arrangements 26, 27 for the y-direction are introduced in the suction lines 21, 22. A variable-length line arrangement is provided in the x-direction and a variable-length line arrangement is provided in the y-direction for every suction stage. In the present case, two suction stages are provided for the aerostatic bearing elements. Of course, it is also possible to provide only one suction stage, but more than two suction stages can also be provided.

Each of the variable-length line arrangements 24-27 comprises two pipe members 28, 29 which penetrate one inside the other, the depth to which they penetrate varying according to the movement of the slides 6 and 8 in x-direction and y-direction. The pipe members 28 of the line arrangement 24, 25 which form penetrating pipes in the present case are connected to the slide 6, while pipe members 29 are connected to the base plate in a stationary manner. The pipe members 28 of the line arrangements 26 and 27 which serve as penetrating pipes are connected to the connection rail 7, and the pipe members 29 are connected to the slide 8 for the y-direction. The suction lines 21, 22 have line elements which are guided inside the slides 5, 6, 8 and connection bar 7. But they can also be provided partially outside the slide, as permitted by the design. Line elements 30 are shown by way of example in FIG. 1.

In the present embodiment example, the gas feed lines 20 are formed as thin, flexible lines because they may have a substantially smaller cross section than the vacuum lines for sucking out the gas and therefore do not interfere with the movements of the slides. However, the feed lines 20 can also be provided with variable-length line arrangements in principle.

If the y-axis, in this case, the connection rail 7, is to be arranged so as to be movable relative to the x-axis so as to enable a certain rotation of the tabletop 10 in the plane (x/y), the suction lines 21, 22 have flexible, elastic intermediate pieces 31 between the slides 5, 6 and the connection elements connecting the connection rail 7, so that angular movements of the y-axis can also be executed. In this case, joint structures 32 are provided.

Figure 4:
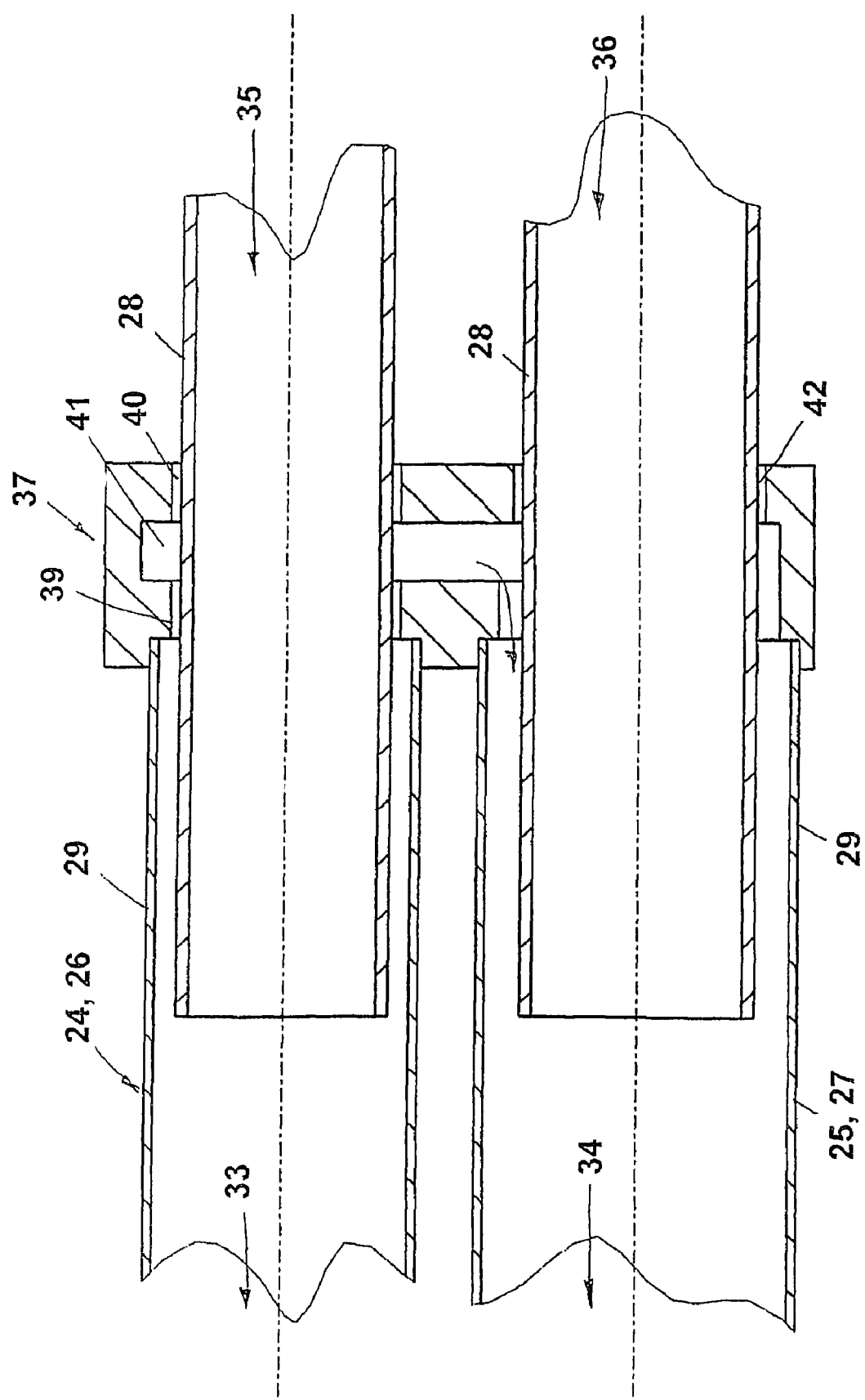
FIG. 4 shows a partial section through a variable-length line arrangement with sealing system, according to the invention.
Figure 5:
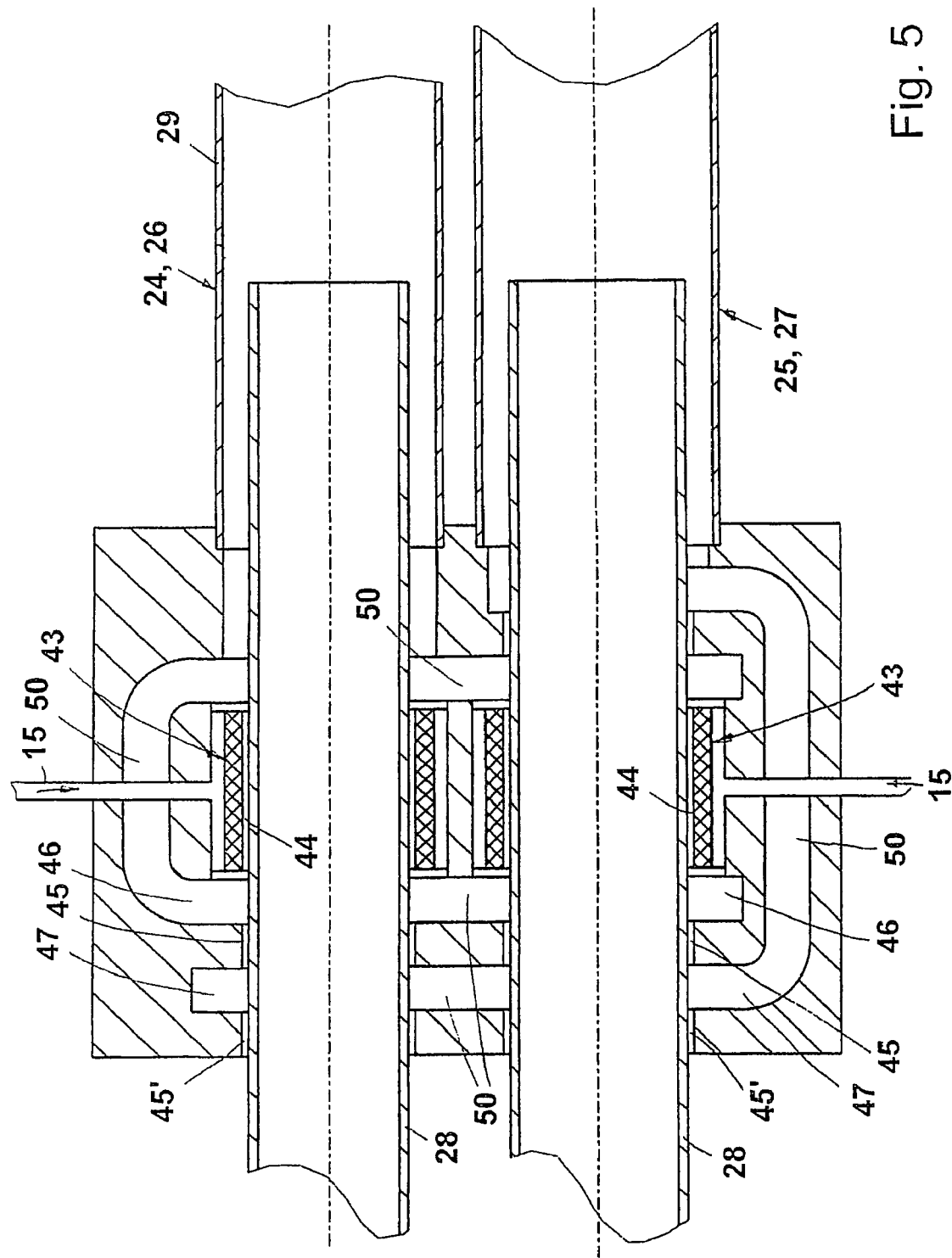
FIG. 5 shows a partial section through the inventive variable-length line arrangement according to another embodiment example with aerostatic bearing elements for guiding the pipe members.
Figure 6:
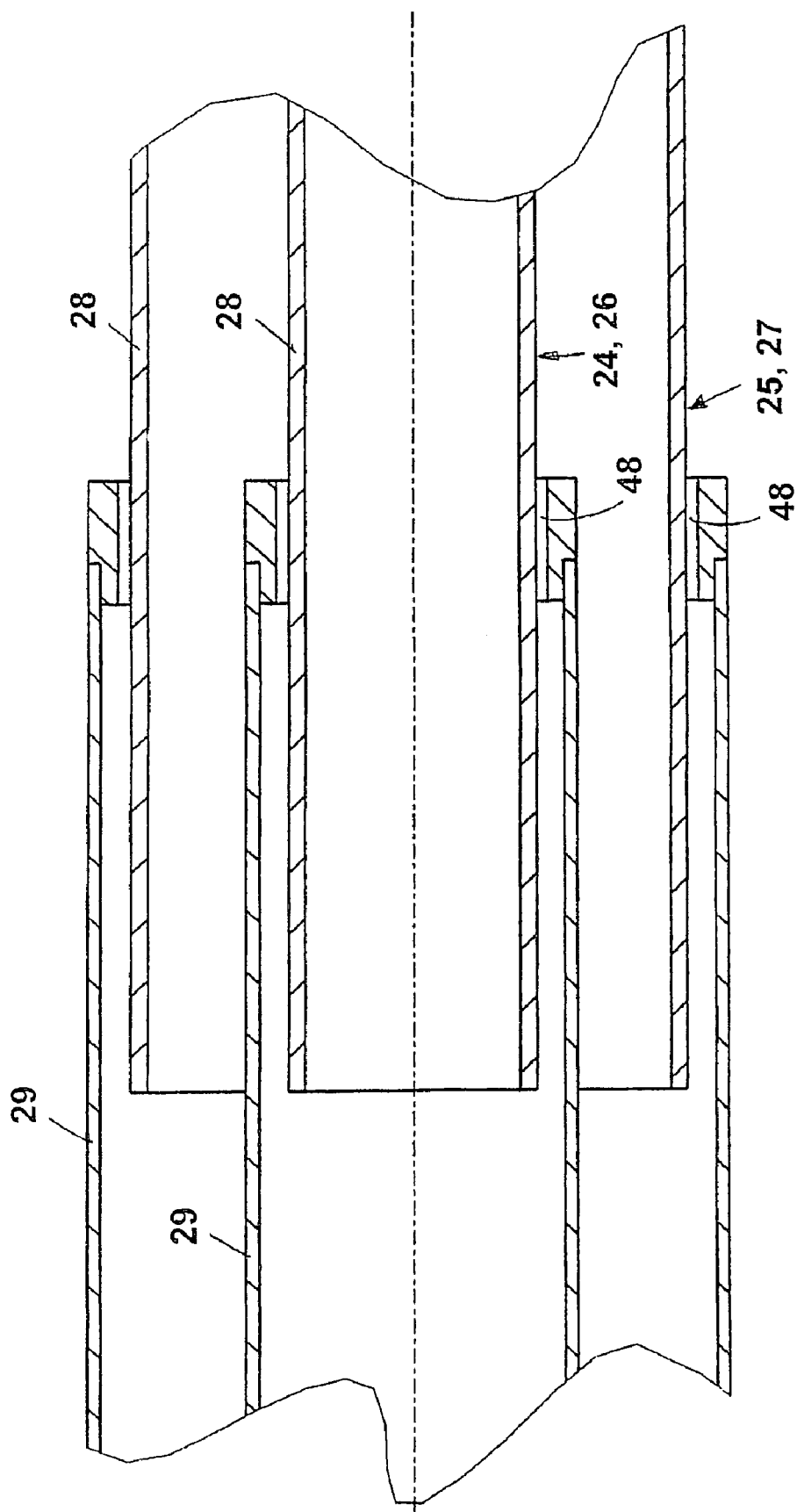
FIG. 6 shows a partial section through an inventive variable-length line arrangement according to another embodiment example with a sealing system.

FIGS. 4, 5 and 6 show different embodiment forms of the variable-length line arrangements and their sealing systems at the location of penetration. FIG. 4 shows two variable-length line arrangements: one for the first suction stage, designated by 24, 26, and one for the second suction stage, designated by 25, 27. A third suction stage with lower pressure can also be arranged, as the case may be. Arrow 33 indicates the gas flow direction to the vacuum pump of the suction lines of the first suction stage, e.g., a fore pump, and arrow 34 shows the gas flow to the vacuum pump of the suction lines of the second suction stage, e.g., a high-vacuum pump, while arrows 35 and 36 indicate the gas flow from the first suction stage of the aerostatic bearing elements and the gas flow from the second suction stage of the aerostatic bearing elements.

Further, the gas flow can also take place in the opposite direction.

The pipe members 28, 29 of the line arrangements 24-27 penetrate one inside the other without contacting. A sealing system 37 is provided around the penetrating pipes 28 and is attached to the pipe members. The penetrating pipe 28 of the first suction stage is sealed with two sealing gaps 39, 40, a suction channel 41 being located between them. The sealing gap 39 is the seal for the suction channel 41, while gap 40 forms that of the vacuum system. The sealing gaps have a height in the range of 20 µm to 60 µm. The suction channel 41 is connected directly to the pipe member 29 of the second suction stage. The penetrating pipe 28 of the second suction stage is sealed by a sealing gap 42 in direction of the vacuum system. The gas flow exiting from the pipe member of the first suction stage is appreciably greater than that exiting from the pipe member of the second suction stage.

In FIG. 5, the penetrating pipe member 28 is guided inside the pipe member 29 with a greater diameter through an aerostatic bearing element 43 in the form of an aerostatic bearing bushing. The supporting regions of the aerostatic bearing elements 43 are designated by 44. In addition to a gas feed 15, the aerostatic bearing elements also have a separate suction. By means of this arrangement, very small sealing gap heights can be realized on the order of 5 µm to 10 µm which have a very good sealing action. The bearing elements 43 are combined to form an assembly for the pipe members of the two suction stages so that the evacuation of the sealing structures required for the bearing elements can be realized in a simple manner. An internal line system 50 connecting the suction channels to the corresponding variable-length line elements is provided inside the aerostatic bearing elements 43 or assembly. The aerostatic bearing elements have first sealing gaps 45 and second sealing gaps 45' in direction of the vacuum system. A first suction channel 46 is provided between the supporting region 44 and the first sealing gap 45, and a second suction channel 47 is provided between the first sealing gap 45 and the second sealing gap 45'. The supporting region of the pipe member of the first suction stage need not be additionally sealed in direction of the pipe. The gas flow exiting in this direction is discharged directly through the pipe member. The gas flow of the supporting region of the pipe member of the second suction stage cannot be introduced directly into the pipe. A single-stage suction is required for this. The gas flow exiting into the vacuum system depends on the diameter and supply parameters of the aerostatic bearing elements used for the variable-length line arrangement.

FIG. 6 shows two variable-length line arrangements which are nested one inside the other, i.e., the pipe members of the individual suction stages are nested one inside the other. In principle, the pipe members of the arrangement penetrate one inside the other again without being guided, and sealing gaps 48 are arranged between the individual pipe members. The sealing gap height corresponds to that of the construction according to FIG. 4. The penetrating pipe member 28 of the first suction stage is the innermost pipe member. The gas flow exiting from the individual sealing gap 48 of the penetrating pipe member of the first suction stage no longer reaches the vacuum system, but rather is trapped directly by the penetrating pipe 28 of the second suction stage. The penetrating pipe or pipe member 28 of this suction stage is in turn sealed relative to the vacuum system by an individual gap 48. The gas flow into the vacuum is accordingly limited to the gas flow exiting from the sealing gap 48 of the penetrating pipe or of the pipe member 28 of the highest suction stage of the gas-guided system.

While this invention has been particularly shown and described with references to preferred embodiments thereof, it will be understood by those skilled in the art that various changes in form and details may be made therein without departing from the scope of the invention encompassed by the appended claims.

What is claimed is:

1. A table for vacuum application guided by means of aerostatic bearing elements, comprising:
   a supporting structure;
   a tabletop displaceable by slides in an x-direction and a y-direction with respect to the supporting structure;
   the slides coupled to the aerostatic bearing elements and being guided by the aerostatic bearing elements along guide rails;
   feed lines for supplying a gas for operation of the aerostatic bearing elements;
   suction lines for removing the gas, the suction lines comprising at least one variable-length line arrangement comprising a first pipe member and a second pipe member moving one inside another without contacting one another; and
   a sealing system being arranged around the first pipe member with at least one sealing gap between the first pipe member and the sealing system, the sealing gap being in a range of 20 μm to 60 μm, the first pipe member penetrating the second pipe member, the sealing system being attached to an end of the second pipe member.

2. The table according to claim 1, wherein the suction lines comprise at least one variable-length line arrangement characterized by a length variable in the x-direction and at least one variable-length line arrangement characterized by a length variable in y-direction.

3. The table according to claim 1, further comprising more than one variable-length line arrangement, wherein the aerostatic bearing elements comprise at least two suction stages arranged one around another for gradually reducing a gas flow exiting into a surrounding vacuum, wherein the suction lines coupled to the respective suction stages are separate from one another, and wherein the variable-length line arrangements are disposed in the suction lines of the respective suction stages.

4. The table according to claim 1, further comprising:
   a first guide rail and a second guide rail fixedly connected to the supporting structure, the first guide rail and the second guide rail being disposed at a distance from one another and extending in the x-direction;
   the slides being comprised of a pair first of slides movably disposed on the first guide rail and the second guide rail, respectively;
   a connection rail fixedly connected to the pair of first slides; and
   a second slide supporting the tabletop movably coupled to the connection rail.

5. The table according to claim 4, wherein:
   a first suction line is variable in the x-direction and comprises the first pipe member fixedly connected to the supporting structure and the second pipe member fixedly disposed at one of the pair of first slides;
   a second suction line is variable in the y-direction and comprises the first pipe member fixedly coupled to the connection rail or to one of said pair of first slides and the second pipe member fixedly disposed at the second slide.

6. The table according to claim 1, wherein an x-axis defining the x-direction and a y-axis defining y-direction are displaceable at an angle relative to one another, and wherein the suction lines have flexible intermediate pieces for following angular movements of the y-axis.

7. The table according to claim 1, wherein the sealing system comprises aerostatic bearing elements in the form of gas bearing bushings.

8. The table according to claim 7, wherein the gas bearing bushings are combined to form an assembly.

9. The table according to claim 1, comprising a plurality of variable-length line arrangements nested inside one another.

10. A table for vacuum application guided by means of aerostatic bearing elements, comprising:
    a supporting structure;
    slides coupled to the aerostatic bearing elements, the slides serving to guide the aerostatic bearing elements;
    feed lines for supplying a gas for operation of the aerostatic bearing elements;
    suction lines for removing the gas, the suction lines comprising at least one variable-length line arrangement comprising a first pipe member and a second pipe member moving one inside another without contacting one another;
    a tabletop displaceable by the slides in an x-direction and a y-direction with respect to the supporting structure;
    a plurality of variable-length line arrangements of different suction stages arranged adjacent to one another;
    a first at least one variable-length line arrangement having a sealing system between the first pipe member and the second pipe member, which sealing system comprises two sealing gaps and a suction channel located therebetween; and
    a second at least one variable-length line arrangement comprising a sealing gap between a first pipe and the sealing system of the first at least one variable-length line arrangement, wherein the suction channel of the sealing system of the first at least one variable-length line arrangement is connected to the second at least one variable-length line arrangement.

* * * * *